(12) United States Patent
Parks et al.

(10) Patent No.: US 10,636,043 B2
(45) Date of Patent: *Apr. 28, 2020

(54) MANAGING A POWER EXCHANGE USING INTERCONNECT SOCKET ADAPTERS

(71) Applicant: San Diego Gas & Electric Company, San Diego, CA (US)

(72) Inventors: Ken Parks, San Diego, CA (US); Michael Colburn, San Diego, CA (US)

(73) Assignee: SAN DIEGO GAS & ELECTRIC COMPANY, San Diego, CA (US)

( * ) Notice: Subject to any disclaimer, the term of this patent is extended or adjusted under 35 U.S.C. 154(b) by 1049 days.

This patent is subject to a terminal disclaimer.

(21) Appl. No.: 15/130,850

(22) Filed: Apr. 15, 2016

(65) Prior Publication Data

US 2016/0232623 A1 Aug. 11, 2016

Related U.S. Application Data

(63) Continuation of application No. 15/058,105, filed on Mar. 1, 2016, now Pat. No. 10,089,641, which is a (Continued)

(51) Int. Cl.
*G06Q 50/06* (2012.01)
*H01R 24/54* (2011.01)
(Continued)

(52) U.S. Cl.
CPC ......... *G06Q 30/0201* (2013.01); *B60R 16/02* (2013.01); *G01R 3/00* (2013.01);
(Continued)

(58) Field of Classification Search
CPC ...... G01R 11/00–66; G01R 1/00–0416; G01R 3/00; B60R 16/02; H01R 33/94;
(Continued)

(56) References Cited

U.S. PATENT DOCUMENTS 4,977,482 A 12/1990 Langdon et al.
5,572,396 A 11/1996 Robinson
(Continued)

OTHER PUBLICATIONS

Patent Cooperation Treaty, International Search Report for PCT/US2016/041612, dated Dec. 2, 2016, pp. 1-4.

*Primary Examiner* — Huy Q Phan
*Assistant Examiner* — David B Frederiksen
(74) *Attorney, Agent, or Firm* — Sheppard Mullin Richter & Hampton LLP

(57) ABSTRACT

A power exchange includes an energy exchange server and a plurality of exchange controllers, each exchange controller communicatively coupled to an interconnect socket adapter, wherein the energy exchange server receives a real-time energy consumption data set, a real-time energy production data set, a set of environmental parameters and a starting energy price, and generates a current aggregate electricity demand value as a function of the real-time energy consumption data set and the environmental parameters, a current aggregate electricity supply value as a function of the real-time energy production dataset and the environmental parameters, and a current energy price as a function of the starting energy price, the current aggregate electricity demand value, and the current aggregate electricity supply value.

16 Claims, 14 Drawing Sheets

Related U.S. Application Data continuation-in-part of application No. 14/796,902, filed on Jul. 10, 2015, now Pat. No. 9,772,347, which is a continuation-in-part of application No. 14/472,269, filed on Aug. 28, 2014, now Pat. No. 9,995,768.

(60) Provisional application No. 61/871,090, filed on Aug. 28, 2013.

(51) Int. Cl.
| | | |
|---|---|---|
| H02B 1/03 | (2006.01) | |
| G06Q 30/02 | (2012.01) | |
| H01R 33/94 | (2006.01) | |
| G01R 22/06 | (2006.01) | |
| G01R 3/00 | (2006.01) | |
| B60R 16/02 | (2006.01) | |
| G05F 1/66 | (2006.01) | |
| H01R 31/02 | (2006.01) | |
| H02J 3/38 | (2006.01) | |
| H02J 3/00 | (2006.01) | |
| G01R 1/04 | (2006.01) | |
| H01R 33/76 | (2006.01) | |

(52) U.S. Cl.
CPC .......... G01R 22/061 (2013.01); G01R 22/065 (2013.01); G05F 1/66 (2013.01); G06Q 30/0206 (2013.01); G06Q 50/06 (2013.01); H01R 24/542 (2013.01); H01R 31/02 (2013.01); H01R 33/94 (2013.01); H02B 1/03 (2013.01); H02J 3/008 (2013.01); H02J 3/383 (2013.01); H02J 3/386 (2013.01); G01R 1/0416 (2013.01); H01R 33/7635 (2013.01); Y02P 80/11 (2015.11); Y04S 50/00 (2013.01); Y04S 50/14 (2013.01); Y04S 50/16 (2018.05); Y10T 29/49208 (2015.01)

(58) Field of Classification Search
CPC .......... H01R 31/02; H02J 3/383; H02J 3/386; H02B 1/03–0526; G06Q 30/0201
See application file for complete search history.

(56) References Cited

U.S. PATENT DOCUMENTS

| | | |
|---|---|---|
| 5,834,932 A | 11/1998 | May |
| 5,894,422 A | 4/1999 | Chasek |
| 6,112,158 A | 8/2000 | Bond et al. |
| 6,188,145 B1 | 2/2001 | Stewart |
| 7,540,767 B1 | 6/2009 | Czarnecki |
| 7,648,389 B1 | 1/2010 | Scott et al. |
| 7,994,934 B2 | 8/2011 | Kagan |
| 8,260,695 B1* | 9/2012 | Rosenberg ........... G01R 21/133 323/220 |
| 8,368,386 B2 | 2/2013 | Reineccius |
| 8,784,130 B2 | 7/2014 | Scott et al. |
| 8,855,019 B2 | 10/2014 | Elliott et al. |
| 9,047,074 B2 | 6/2015 | Pfeifer et al. |
| 9,500,572 B2 | 11/2016 | Bautista et al. |
| 2002/0171436 A1 | 11/2002 | Russell |
| 2004/0024483 A1* | 2/2004 | Holcombe ............ G06Q 30/02 700/122 |
| 2005/0027464 A1 | 2/2005 | Jonker et al. |
| 2005/0194962 A1 | 9/2005 | Briese et al. |
| 2009/0091291 A1 | 4/2009 | Woody et al. |
| 2009/0108680 A1 | 4/2009 | Minemura |
| 2009/0124119 A1 | 5/2009 | Austin |
| 2010/0003848 A1 | 1/2010 | Scott et al. |
| 2010/0128418 A1 | 5/2010 | Pruehs et al. |
| 2010/0217452 A1* | 8/2010 | McCord ................. G06Q 50/06 700/295 |
| 2010/0217549 A1* | 8/2010 | Galvin ..................... H04B 3/54 702/62 |
| 2010/0225305 A1 | 9/2010 | Reineccuis |
| 2010/0332373 A1* | 12/2010 | Crabtree ................ G06Q 40/04 705/37 |
| 2011/0001356 A1 | 1/2011 | Pollack |
| 2011/0010043 A1 | 1/2011 | Lafky |
| 2011/0040785 A1 | 2/2011 | Steenberg et al. |
| 2011/0212648 A1 | 9/2011 | Fish |
| 2011/0237118 A1 | 9/2011 | Feldman et al. |
| 2011/0248858 A1 | 10/2011 | Onodi et al. |
| 2012/0023039 A1 | 1/2012 | Kremen |
| 2012/0097045 A1 | 4/2012 | Kurimoto et al. |
| 2012/0191387 A1 | 7/2012 | Yamanaka et al. |
| 2012/0229082 A1 | 9/2012 | Vukojevic et al. |
| 2012/0276775 A1 | 11/2012 | Garwood et al. |
| 2013/0020991 A1 | 1/2013 | Deboer et al. |
| 2013/0026986 A1 | 1/2013 | Parthasarathy et al. |
| 2013/0086253 A1 | 4/2013 | Cutler et al. |
| 2013/0110296 A1 | 5/2013 | Khoo et al. |
| 2014/0049109 A1* | 2/2014 | Kearns ..................... H02J 3/00 307/52 |
| 2014/0098470 A1 | 4/2014 | Robinson et al. |
| 2014/0127935 A1 | 5/2014 | Scott et al. |
| 2014/0218010 A1 | 8/2014 | Fulton et al. |
| 2014/0312841 A1 | 10/2014 | Baba |
| 2015/0061644 A1 | 3/2015 | Parks et al. |
| 2015/0162157 A1 | 6/2015 | Luebke et al. |
| 2015/0309075 A1 | 10/2015 | Parks et al. |
| 2016/0181752 A1 | 6/2016 | Parks et al. |
| 2016/0236634 A1 | 8/2016 | Parks et al. |
| 2016/0238633 A1 | 8/2016 | Parks et al. |
| 2016/0239035 A1 | 8/2016 | Parks et al. |
| 2016/0247171 A1* | 8/2016 | Parks ..................... B60R 16/02 |
| 2016/0247241 A1 | 8/2016 | Parks et al. |
| 2016/0247242 A1 | 8/2016 | Parks et al. |

\* cited by examiner

MANAGING A POWER EXCHANGE USING INTERCONNECT SOCKET ADAPTERS

RELATED APPLICATIONS

This application is a continuation of U.S. application Ser. No. 15/058,105, filed on Mar. 1, 2016, which is a continuation-in-part of U.S. patent application Ser. No. 14/796,902, filed on Jul. 10, 2015, which is a continuation-in-part of U.S. patent application Ser. No. 14/472,269, filed on Aug. 28, 2014, which claims priority to U.S. Provisional Patent Application No. 61/871,090 filed on Aug. 28, 2013, each of which is hereby incorporated herein by reference in the respective entirety of each.

TECHNICAL FIELD

This disclosure relates generally to electrical components, and more particularly, some embodiments relate to managing a power exchange using interconnect socket adapters.

BACKGROUND

A distribution panel is the hub where an electrical power feed is divided into subsidiary circuits. Typically, distribution panels of different capacities (e.g., 400 Amps and smaller) are installed to homes depending on their electrical usage needs. Power carried by the electrical power feed is distributed to the loads via the distribution panel. Therefore, a contemplated increased load that results in more electrical current flowing through the distribution panel may require changing an existing distribution panel to accommodate the current change (increase). Furthermore, with the emergence of renewable energy sources, a user that traditionally consumes electrical power may provide electrical power into a distribution grid at certain times. The additional circuit capacity required to accommodate this back feed of energy may exceed the usable current capacity of an existing distribution panel, requiring the existing distribution panel to be upgraded to the next standard capacity. The need to apply energy sources and/or sinks, including energy storage, may drive the need for such work.

In many cases, there is no physical room in the distribution panel for more circuits. A distribution panel is limited to a certain amount of electrical circuits (i.e. breaker positions). New circuits may be added if there are unused breaker positions in the existing distribution panel; otherwise, the existing distribution panel needs to be replaced by a distribution panel with a larger capacity, which will provide additional breaker positions. Even if spare breaker positions exist, the projected load calculated considering the mix of circuits and equipment already served by the panel, may dictate that an upgrade be performed.

BRIEF SUMMARY OF THE EMBODIMENTS

According to various embodiments of the disclosed technology, a system for connecting multiple electrical devices to an electrical power grid is provided, comprising an interconnection meter socket adapter having a housing enclosing a set of electrical connections. The interconnection meter socket adapter may be configured to be coupled to a standard distribution panel and a standard electrical meter. A power regulation module coupled to a connector enables a plurality of electrical sources and/or sinks to be connected to the interconnection meter socket adapter. In various embodiments, the power regulation module may include one or more switches that may be disabled or enabled according to the net power exchange of the customer, as measured by the utility revenue meter. The power regulation module may obtain data on the net power production/consumption (from customer loads and power sources and/or sinks connected to the power regulation module) and determine which of the plurality of connected electrical devices (sources and/or sinks) to allow to connect to the power grid.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

Figure 1:
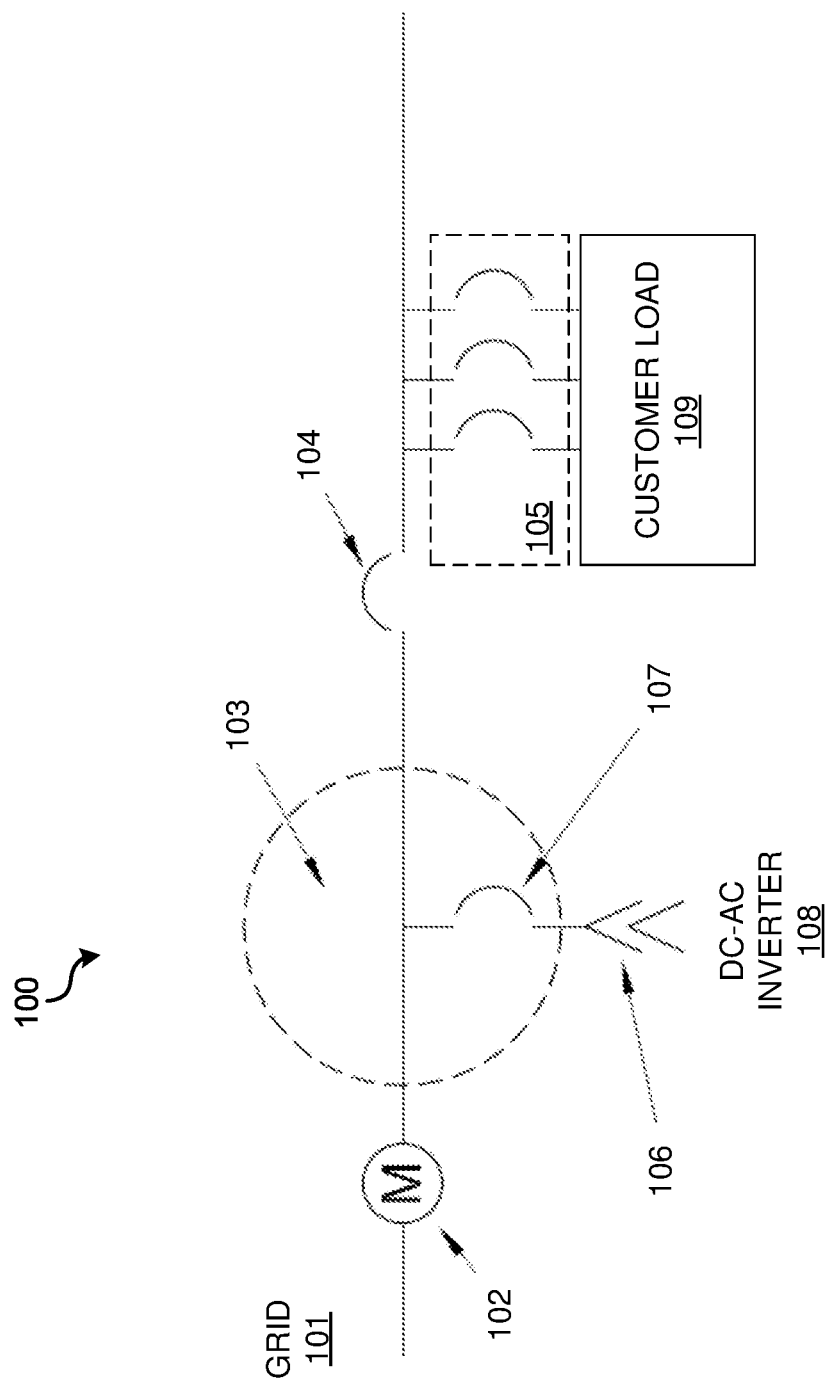
FIG. 1 is a diagram illustrating an example installation of an interconnection meter socket adapter, in accordance with embodiments disclosed herein.

The figures are not intended to be exhaustive or to limit the invention to the precise form disclosed. The figures are not drawn to scale. It should be understood that the disclosed technology can be practiced with modification and alteration, and that the disclosed technology be limited only by the claims and the equivalents thereof.

DETAILED DESCRIPTION OF THE EMBODIMENTS

Conventionally, when introducing renewable and/or distributed energy such as solar energy, fuel cells, wind energy, and energy storage, a DC-AC inverter is needed to interface the renewable and/or distributed energy to AC energy so that the energy resource may be coupled to an electrical power system (i.e a power grid). Even after considering local loads, and especially in the case of energy storage, this may cause a large amount of current exchanged with the distribution power grid, which may require an existing distribution panel to be changed. Some existing technologies, such as hard wired adapters are not allowed in many utility service areas as they do not meet service standards due to customer wiring in the utility space behind the meter. There are also physical clearance constraints and requirements related to gas meter sets that limit the use of adapters. In addition, these hard wired adapters require a professional, qualified electrician for removal or installation, and also lack the ability to monitor bi-directional power flow in real time. Only the net amount between generation and consumption is measured, e.g., by the existing utility revenue meter.

Interconnection meter socket adapters are provided. Various embodiments may be under utility seal and ownership. Customer (considering the distinction between customer wiring, and utility conductors) wiring (which are separate from utility conductors) behind the meter is avoided, which allows a utility company to own and maintain the connection all the way up to the customer's main disconnecting means. In one embodiment, an interconnection meter socket adapter comprises a housing enclosing a set of electrical connections. The interconnection meter socket adapter may be configured to be coupled to a standard distribution panel and a standard, self-contained electrical meter. Various embodiments may establish connections between a distribution panel and a user such that electrical power may be delivered to the user while an electrical meter may still measure the power consumption of the user.

In addition, various embodiments are configured to be coupled to a DC-AC inverter, which may be coupled to various energy sources, or source/sinks. As such, the energy sources are coupled to an electrical power system. In some embodiments, a connector such as a flexible cable (e.g., to a length of six feet or more to allow clearance from other devices such as gas meter sets) or flexible conduit containing insulated wires may be provided. Therefore, an interconnection meter socket adapter may be installed far enough away from a gas riser thereby meeting service standards for clearance. Further embodiments may comprise a measurement module for monitoring the bi-directional power flow through an interconnection meter socket adapter. That is, the power consumption of the user and/or an energy sink as well as the energy generation of an energy source may be monitored. The real-time data may be provided by a communication module and used for electrical power system planning and/or operating purposes, and for other purposes.

FIG. 1 is a diagram illustrating an example installation 100 of an interconnection meter socket adapter 103, in accordance with an embodiment of the disclosure. In the illustrated example, customer loads 109 are coupled to a power distribution grid 101. As illustrated, the interconnection meter socket adapter 103 is installed between the utility revenue meter 102 and an existing customer main breaker 104. The interconnection meter socket adapter 103 may allow the energy source and the energy sink to connect to the power distribution grid 101 without changing or upgrading the distribution panel.

The interconnection meter socket adapter 103 electrically bypasses the entire breaker and buswork section of a distribution panel. The interconnection meter socket adapter 103 is installed electrically between existing main breaker 104 and the utility revenue meter 102. In various embodiments, the interconnection meter socket adapter 103 is cylindrical. An interconnection meter socket adapter 103 may mimic the connector arrangement of a revenue meter on one side, and the connector arrangement of the customer main panel on the other side. The interconnection meter socket adapter 103 may be installed under utility seals. The interconnection meter socket adapter 103 comprises a buswork internal to the cylinder or other housing that couples the inverter 108 to a tap on the load side of the utility revenue meter 102, while maintaining the connectivity of existing customer loads. Continuous connectivity is thereby maintained between the power distribution grid 101 and the customer's permanent main breaker 104 and the branch circuits (loads 109) of the customer distribution panel 105.

The interconnection meter socket adapter 103 may provide a separable connector 106. The connector 106 may include a flexible cable or flexible conduit containing insulated wires. The separable connector 106 couples the energy source and/or the energy sink to the power grid 101. A DC-AC inverter 108 is coupled to an energy source/sink (e.g., solar energy, wind energy, energy storage, fuel cells, or any other source) (not shown) and the separable connector 106, which is coupled to the interconnection meter socket adapter 103. By converting the DC energy generated by the energy source into AC energy, the DC-AC inverter 108 injects real and/or reactive power flow into the power grid 101. In some embodiments, the separable connector 106 may also be coupled to an energy sink (e.g., an electric vehicle charging system, or other energy storage device), with the inverter operating as a rectifier, converting AC, to DC energy. In some embodiments, an interconnection meter socket adapter 103 may comprise a breaker 107, which is coupled to the separable connector 106. The breaker 107 may be a resettable over current or other breaker protection device. The breaker 107 may be sized appropriately according to the National Electric Code (NEC).

In further embodiments, an interconnection meter socket adapter 103 may comprise a measurement module and a communication module. The communication module may be coupled to the measurement module. The measurement module may monitor the bidirectional real and reactive power flow through the interconnection meter socket adapter 103. The measurement may be provided to a customer and/or a utility company for load and/or generation monitoring. The communication module may provide the measurement to a data collection device, including a central server or other data handling medium.

Figure 2B:
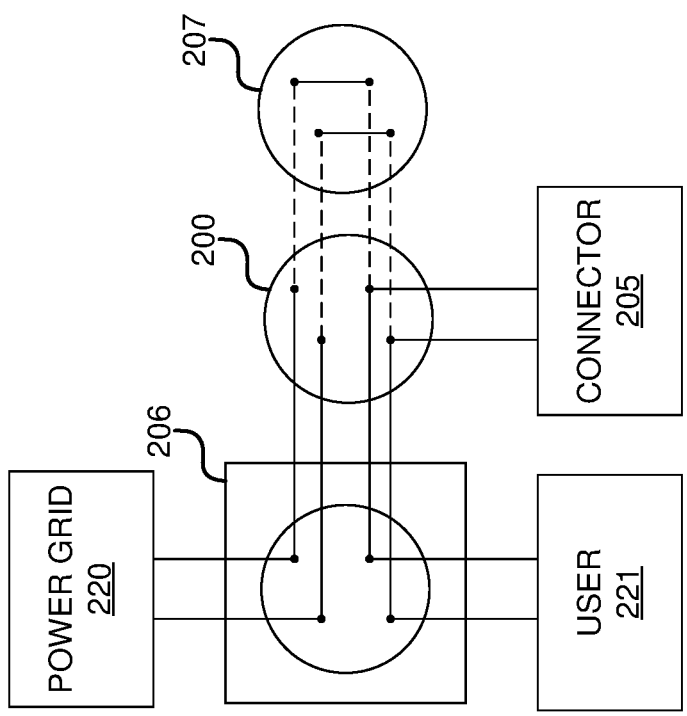
FIG. 2B illustrates an example circuit diagram of an interconnection meter socket adapter in a load-side configuration, in accordance with embodiments disclosed herein.
Figure 2A:
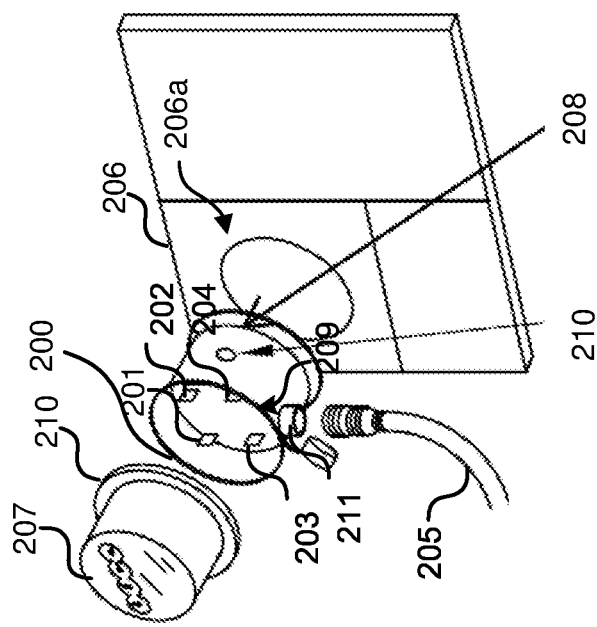
FIG. 2A illustrates an example interconnection meter socket adapter in accordance with an embodiment, in accordance with embodiments disclosed herein.

FIG. 2A-2B illustrates an exemplary interconnection meter socket adapter as well as its circuit diagram in accordance with an embodiment. FIG. 2A illustrates an exemplary interconnection meter socket adapter 200 in accordance with an embodiment. The interconnection meter socket adapter 200 may be installed physically between a meter 207 and a distribution panel 206. By way of example, the meter 207 may be a standard electricity meter that is either analog or digital. The meter 207 may be installed (e.g., plugged into) the distribution panel 206 directly. The interconnection meter socket adapter 200 may establish physical connectivity between the distribution panel 206, the meter 207, and a customer, such that the customer (i.e. load) side of the meter 207 is tapped. During operation, the meter 207 may still measure the net energy consumption of a user. In some embodiments, the meter 207 may be plugged into the interconnection meter socket adapter 200 rather than being plugged into the distribution panel 206. The interconnection meter socket adapter 200 comprises a set of jaw blades 201-204 (shown in FIG. 3B), wherein each of the jaw blades 201-204 electrically couple to a corresponding contact clip disposed on the surface of the distribution panel 206. The interconnection meter socket adapter 200 also comprises a set of sockets (shown in FIG. 3A), each socket contacting a corresponding clip, jaw blade or other contact of the meter 207.

In some embodiments, the interconnection meter socket adapter 200 is cylindrical and comprises flanges 208-209 (shown in FIG. 2A). In the illustrated example, the flange 208 is covered by a ring, together securing the interconnection meter socket adapter 200 to the distribution panel 206, when the meter socket adapter 200 is plugged into the distribution panel 206. The flange 209 and the ring 210 (not sure this is clear in FIG. 2A) of the meter 207 fix the meter 207 to the interconnection meter socket adapter 200. In some embodiments, the interconnection meter socket adapter 200 may be utilized with "ringless" meter panels, where the meter is held in by the panel cover 206a, which is then separately secured to the remainder of the distribution panel. For such embodiments, the panel cover 206a may include an embossment within the panel cover 206a, designed to secure the interconnection meter socket adapter 200 without the need for a separate securing ring (e.g., ring 210). In addition, the interconnection meter socket adapter 200 may include a coupler 211 to which a connector 205 may be coupled. In the illustrated example, the coupler 211 is a receptacle to the connector 205. In various embodiments, the connector 205 is affixed to a flexible cable or flexible conduit of various lengths containing insulated conductors, exiting the body of the interconnection meter adapter at various positions along the exterior of the device. One end of the conduit/cable and connector assembly 205 is coupled to the interconnection meter socket adapter 200 and the other end is coupled to the energy source or the energy sink. As such, the energy source or an energy sink is coupled to the power grid via the interconnection meter socket adapter 200 without changing or upgrading the distribution panel 206.

FIG. 2B is an example circuit diagram of an interconnection meter socket adapter 200. As illustrated, two phase wires (typically energized between 200 and 250 Volts) couple the power grid 220 to the user 221 via a distribution panel 206. Further, the connector assembly 205, which may be coupled to an energy source or an energy sink, is coupled to the interconnection meter socket adapter 200. By installing the interconnection meter socket adapter 200 to the distribution panel 206, the connector assembly 205 and the user 221 are coupled in parallel, both of which may be coupled to the power grid 220. By installing the meter 207 to the interconnection meter socket adapter 200, the connector 205 and the user 221 are coupled to the power grid 220. The interconnection meter socket adapter 200 is plugged into the distribution panel 206 thereby making connections to the incoming wires from the power grid 220. In various embodiments, such connections are established by fitting a set of jaw blades of the interconnection meter socket adapter 200 into the corresponding contact clip in the distribution panel 206. The meter 207 is plugged into the interconnection meter socket adapter 200 thereby making connections to the incoming wires from a power grid 220 and the user 221 as well as the connector assembly 205. In various embodiments, such connections are established by fitting a set of jaw blades on meter 207 into corresponding contact clips in the interconnection meter socket adapter 200.

Within the housing of the interconnection meter socket adapter 200, a set of connections are provided. When installed, the set of connections enable an energy source and/or an energy sink to be installed in parallel with a user such that no permanent change or upgrade is required in the distribution panel. In various embodiments, the connector 205 may be a flexible cable or flexible conduit containing insulated conductors serving as an interface for an inverter output. The inverter may be disconnected in case of the need for panel or meter service.

Figure 3B:
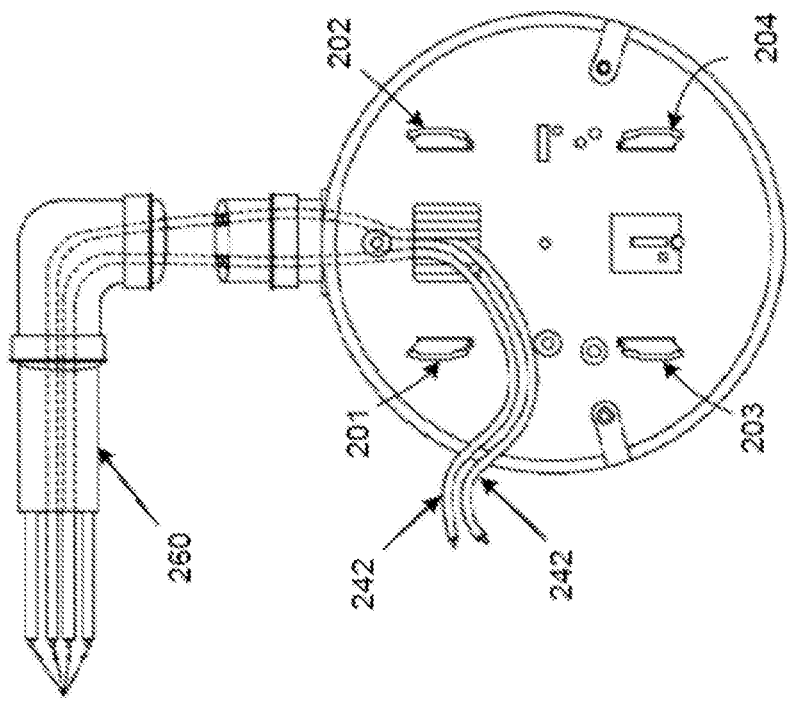
FIG. 3B is a rear view illustrating the physical electrical wiring of the interconnection meter socket adapter of FIG. 2A, in accordance with embodiments disclosed herein.
Figure 3A:
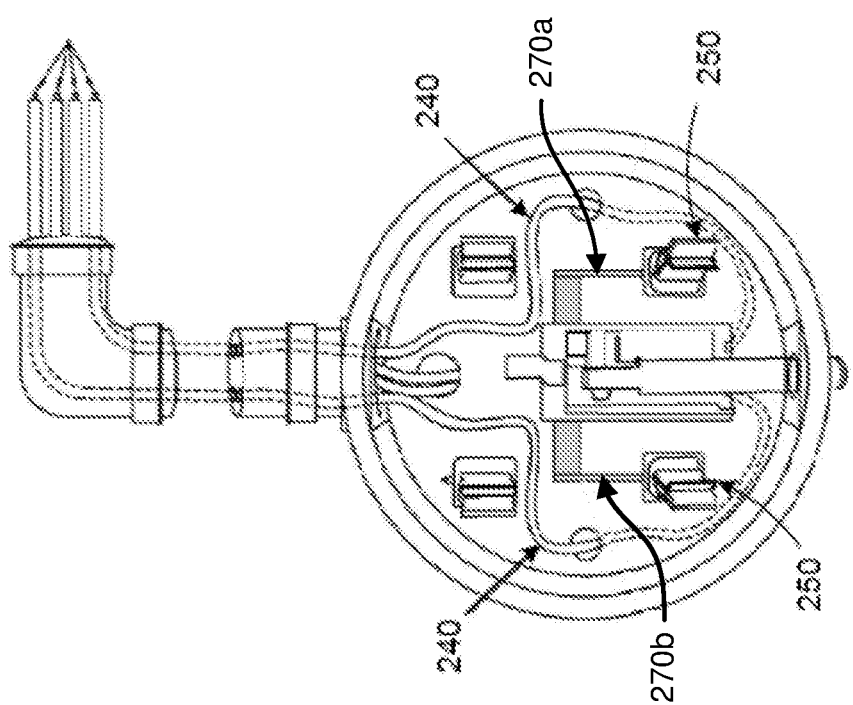
FIG. 3A is a front view illustrating the physical electrical wiring of the interconnection meter socket adapter of FIG. 2A, in accordance with embodiments disclosed herein.

FIGS. 3A-3B are front and rear views, respectively, illustrating the electrical wiring of the interconnection meter socket adapter 200 in accordance with an embodiment. As illustrated, four wires enter the interconnection meter socket adapter 200 including two phase wires 240, a neutral wire 242, and a ground wire 244. Phase wires 240 terminate on clips 250 that connect with jaw blades 203 and 204, and busbars 270a, 270b. Typically, phase wires 240 are energized at 240V, but can be energized at voltages ranging from 197 to 252 V, approximately. Neutral wire 242 and ground wire 244 terminate on the customer's electrical panel ground bus. The interconnection meter socket adapter 200 can include a flexible conduit 260 that protects of the wires from weather.

Figure 4:
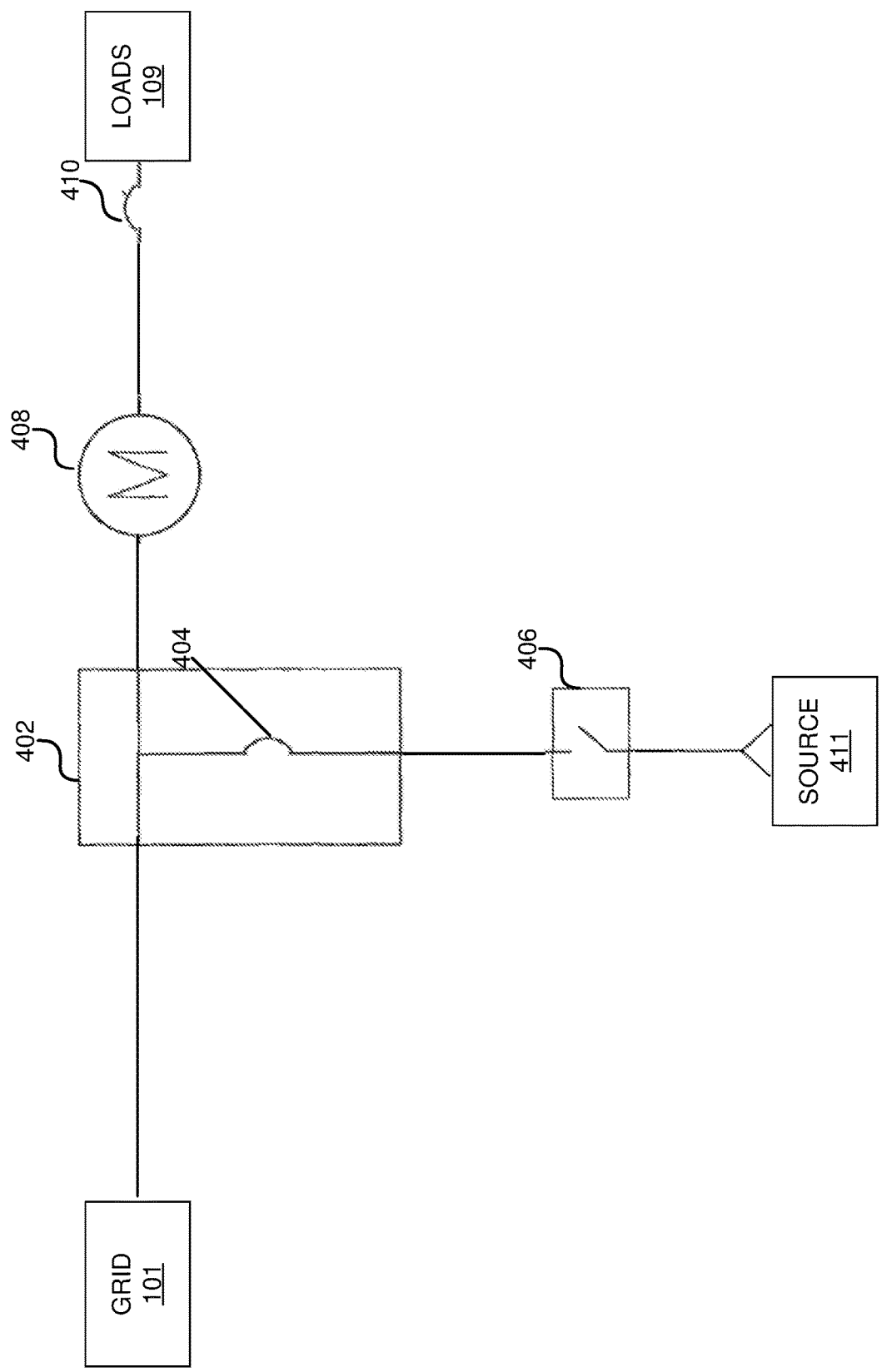
FIG. 4 is an one-line diagram illustrating an example installation of an interconnection meter socket adapter with a line side (source) connection at the meter, in accordance with embodiments disclosed herein.

FIG. 4 is a diagram illustrating an example installation of an interconnection meter socket adapter 402. In the illustrated example, the customer loads 109 are coupled to the power system distribution grid 101. As illustrated, the interconnection meter socket adapter 402 is electrically installed between the utility revenue meter 408 and power grid 101, in contrast to the embodiment illustrated in FIG. 1 wherein the interconnection meter socket adapter is electrically installed between the utility revenue meter 102 and the customer's distribution panel main breaker 410. In either embodiment, the interconnection meter socket adapter 402 may allow an energy source or an energy sink 411 connect to the power grid 101 without chaning or upgrading the distribution panel.

Referring still to FIG. 4 and the embodiment illustrated therein, the interconnection meter socket adapter 402 electrically bypasses the entire breaker and buswork section of a distribution panel. The interconnection meter socket adapter 402 may be cylindrical and may mechanically couple to the distribution panel on one side, and to the utility revenue meter on the other side. An interconnection meter socket adapter 402 may mimic the connector arrangement of a revenue meter on one side, and the connector arrangement of the customer main panel on the other side, and may be installed under utility seals.

In some examples, the interconnection meter socket adapter 402 includes a set of jaw blades configured to make contact with the distribution panel, such that the interconnection meter socket adapter may be easily coupled to contact clips in the distribution panel, and may similarly couple to the utility revenue meter 408. The interconnection meter socket adapter 402 may also incorporate an electrical coupler configured to accept a connector. The electrical coupler, for example, may mechanically attach to a side collar of the interconnection meter socket adapter's housing, and in the present embodiment, may also detachably couple to a connector. The electrical coupler, when attached to the connector, also electrically couples the connector to the line (source) side of the interconnection meter socket adapter 402. Interconnection meter socket adapter 402 may also include a breaker coupled between the electrical coupler and the grid (source) side of the meter.

The connector may, for example, include a cable harness that may couple to an energy source or an energy sink. For example, an energy source may be a renewable energy source, such as solar electric, wind or fuel cell energy production system, or an energy storage system, that couples to the connector through a DC-AC inverter or inverter/rectifier. The energy source may also be a conventional generator, or other non-renewable energy source.

The interconnection meter socket adapter 402 may further include a measurement module configured to measure power flow through the interconnection meter socket adapter. For example, the measurement module may include a voltage and/or current meter, and/or other electrical measurement devices. The measurement module may also include a processor and a memory module to store voltage, current, and other measurements, and to generate a signal if power flow reaches a predetermined threshold value. The measurement module may further include a communications module that may transmit the signal to a receiver unit. For example, the communications module may be logically coupled, via a wire or other harness, to the utility revenue meter 408. Alternatively, the communications module may transmit a wireless signal via cellular, Wi-Fi, Bluetooth®, Zigbee, or other wireless communications protocol to a remote receiver unit, and ultimately a computer server, workstation, tablet, laptop, handheld or other device.

Figure 5:
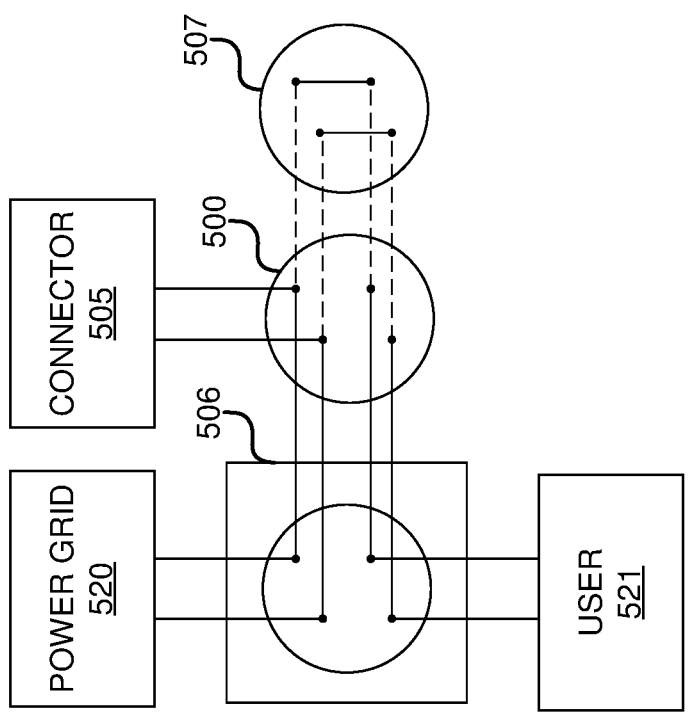
FIG. 5 illustrates an example circuit diagram of an interconnection meter socket adapter with a line-side configuration, in accordance with embodiments disclosed herein.

FIG. 5 illustrates an example circuit diagram of an interconnection meter socket adapter with a line-side configuration. As illustrated, two phase wires (typically energized at 240 volts) couple the power grid 520 to the user 521 via a distribution service panel 506. Further, the connector assembly 505, which may be coupled to an energy source or an energy sink, is coupled to the interconnection meter socket adapter 500. In the embodiment illustrated in FIG. 5, the connector 505 couples to the power grid side (i.e., the line side) of the interconnection meter socket adapter 500, in contrast to the embodiment illustrated in FIG. 2B in which the connector 205 couples to the user (load) side of interconnection meter socket adapter 200. As illustrated in FIG. 5, a set of electrical connections are disposed within the housing of interconnection meter socket adapter 500, wherein an input side of the set of electrical connections electrically couples an input side of the distribution service panel 506 to a utility (grid) side of the utility revenue meter 507 in parallel, and an output side of the set of electrical connections electrically couples an output side of the distribution service panel 506 to a customer side of the utility revenue meter 507 in parallel.

Still referring to FIG. 5, interconnection meter socket adapter 500 is plugged into the distribution panel 506 thereby making connections to the incoming wires from the power grid 520. In various embodiments, such connections are established by fitting a set of jaw blades of the interconnection meter socket adapter 500 into the corresponding contact clips in the distribution service panel 506. The utility revenue meter 507 is plugged into the interconnection meter socket adapter 500 thereby making connections to the incoming wires from a power grid 520 and the user 521 as well as the connector 505. In various embodiments, such connections are established by fitting a set of jaw blades on utility revenue meter 507 into corresponding contact clips in the interconnection meter socket adapter 500.

When installed, the set of electrical connections permit an energy source and/or an energy sink to be installed in parallel with a user such that no permanent change or upgrade is required in the distribution panel. In various embodiments, the connector assembly 505 may include a flexible cable or flexible conduit containing insulated conductors serving as an interface for a renewable energy source (e.g., a solar inverter, or other renewable energy source as disclosed herein), or energy sink (i.e. energy storage or other).

Figure 6:
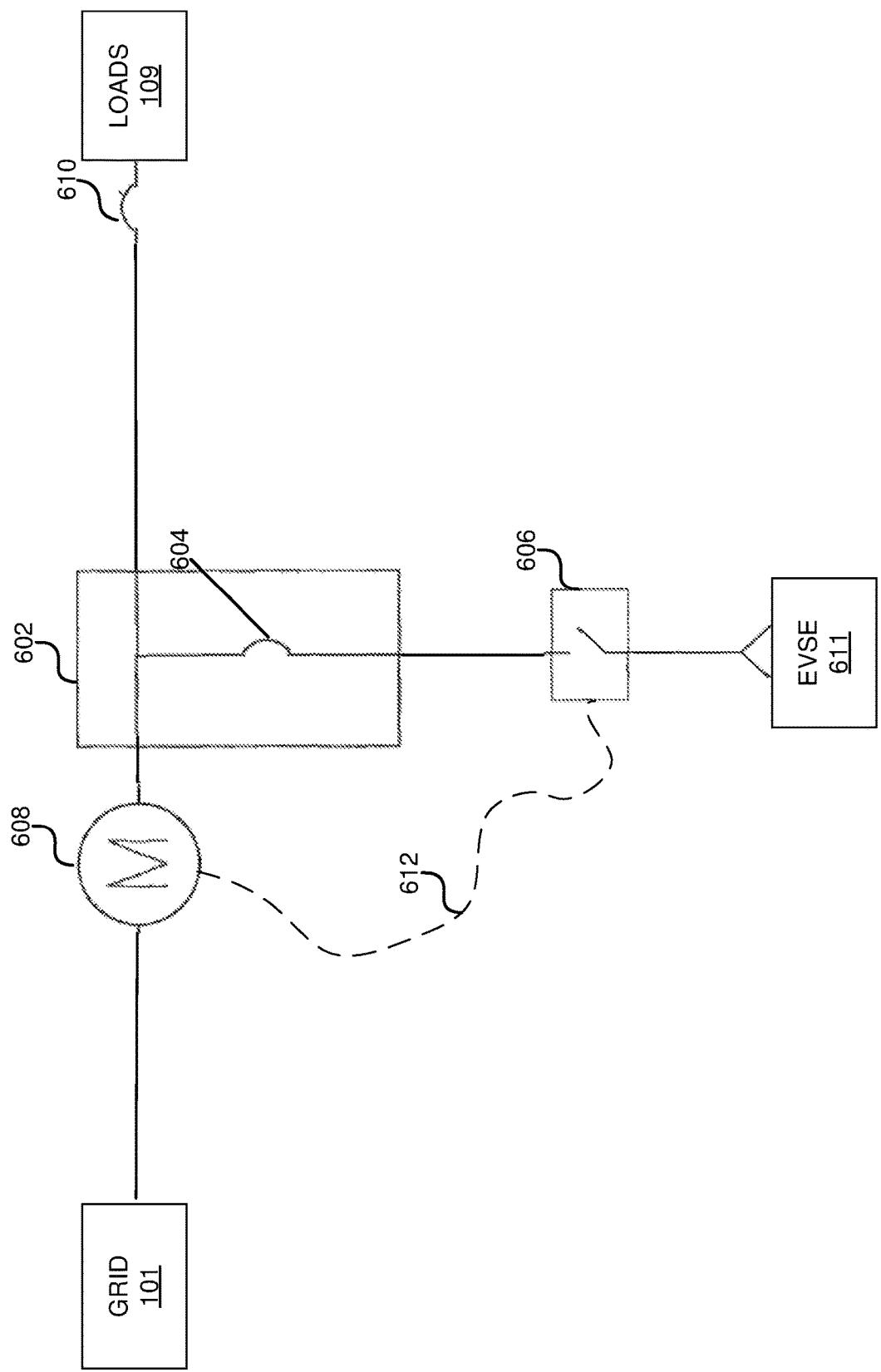
FIG. 6 is a diagram illustrating an example installation of an interconnection meter socket adapter providing telemetered data coupled to an example of an electrical sink, in accordance with embodiments disclosed herein.

FIG. 6 is a diagram illustrating an example installation of an interconnection meter socket adapter for an electrical sink (e.g., Electric Vehicle Supply Equipment, or EVSE). In the illustrated example, the customer loads 109 are coupled to the power system distribution grid 101. As illustrated, the interconnection meter socket adapter 602 is installed between the utility revenue meter 608 and the customer loads 109, for example, by way of a distribution panel (not shown). The interconnection meter socket adapter 602 may include a breaker 604, and may couple through a power regulation module 606 to an energy sink 611. For example, energy sink 611 may be EVSE, a stationary "whole house" battery, or other energy sink (load) as would be understood in the art.

Still referring to FIG. 6, the power regulation module 606 may be configured to regulate power flow to the energy sink 611. For example, power regulation module 606 may include a switch to disconnect power to the energy sink 611. Alternatively (or in addition to the switch), power regulation module 606 may incorporate a limiter, or other power regulation means as known in the art, to selectively reduce or increase (modulate) power flow to energy sink 611. Power regulation module 606 may communicate with utility revenue meter 608 via a wireless or wired communications link 612. A similar power regulation module 406 may be included in the configuration discussed with respect to FIG. 4

In some examples, power regulation module 606 may include a measurement module configured to measure net power flow through the interconnection meter socket. For example, the measurement module may be a voltage and current meter, or other power measurement device as known in the art. The measurement module may also include a processor and a memory to store power measurements, and store a predetermined threshold value (e.g., based on a maximum net power flow based on the rating of the customer's main panel). For example, the threshold may be between 70% and 90% of a main panel rating.

The measurement module may further incorporate a communications module (e.g., hard wired, cellular, Wi-Fi, Bluetooth®, Zigbee, or other wireless protocol as known in the art). In some examples, when the net power usage measured by the measurement module exceeds the threshold value, the measurement module may transmit a suspend signal through the communications module. The suspend signal may then be received by the power regulation module 606 to reduce or suspend power flow to energy sink 611. For example, power regulation module 606 may open the connection between the interconnection meter socket adapter 602 and the energy sink 611. When net power flow reduces over time (for example, the power draw by the customer loads 109), such that it falls below a second, lower threshold value, the measurement module may transmit a resume signal through the communications module. The power regulation module 606 may then receive the resume power flow signal to the energy sink 611 (for example, by restoring the connection). By regulating power in this way, the interconnection meter socket adapter 602 may avoid exceeding allowable NEC equipment ratings when operating electrical appliances at the same time as, for example, charging an electric vehicle battery while also running air conditioning or other major appliance.

Figure 7:
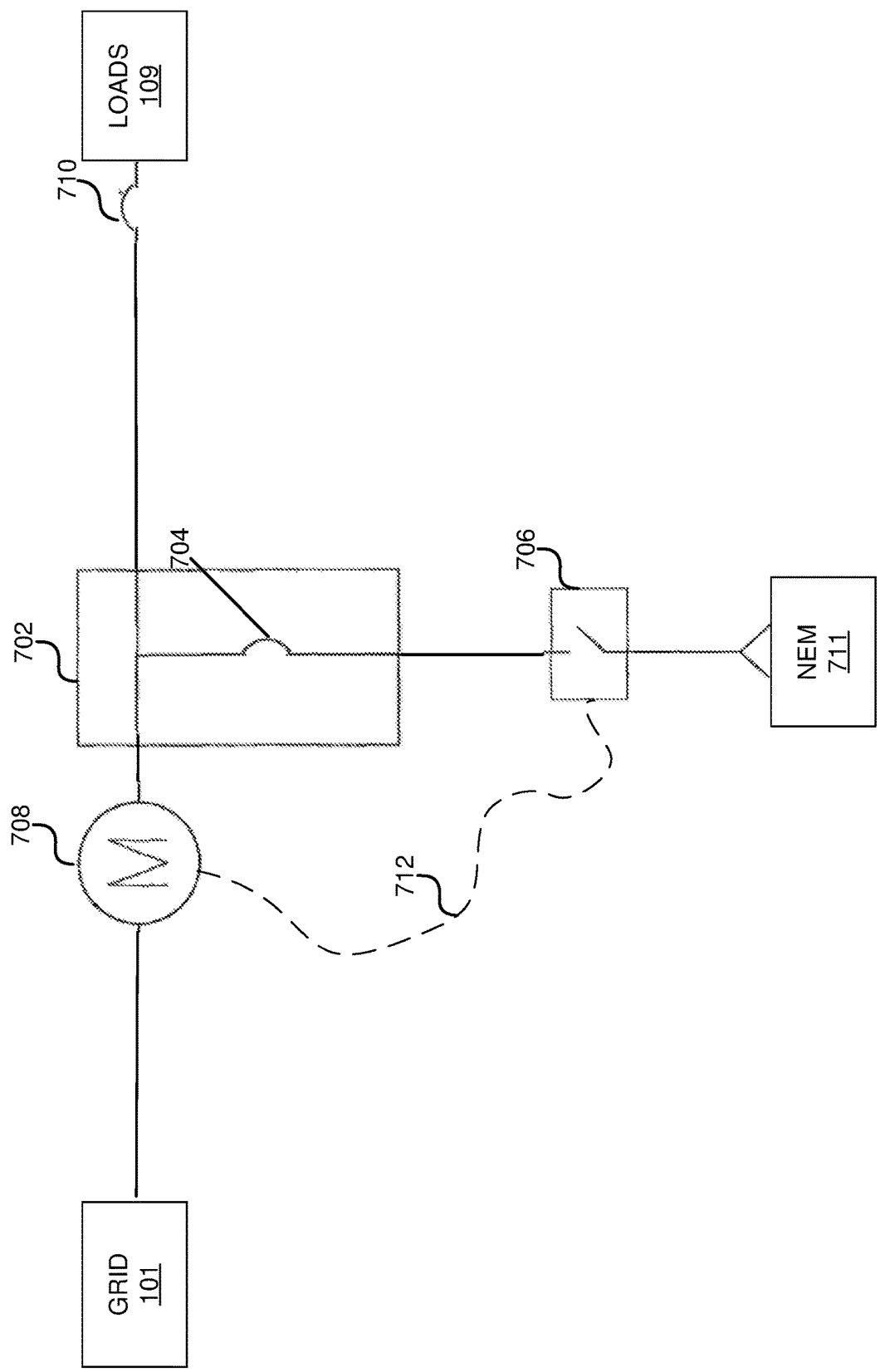
FIG. 7 is a diagram illustrating an example installation of an interconnection meter socket adapter providing telemetered data from an example of a renewable distribution resource, in accordance with embodiments disclosed herein.

FIG. 7 is a diagram illustrating an example installation of an interconnection meter socket adapter providing telemetered data from renewable distribution resources. In the illustrated example, the customer loads 109 are coupled to the power system distribution grid 101. As illustrated, the interconnection meter socket adapter 702 is electrically installed between the utility revenue meter 708 and the customer loads 109, for example, by way of a distribution panel (not shown). The interconnection meter socket adapter 702 may include a breaker 704, and may couple through a power regulation module 706 to a net-metering measurement module 711, which may in turn, couple to an energy source. For example, the energy source may be a renewable energy source, such as a solar panel (or set of panels) and inverter(s), a net-metering measurement module electrically coupled to the connector and configured to measure power produced by the renewable energy power source. Power regulation module 706 may communicate with utility revenue meter 708 via a wireless or wired communications link 712.

The net-metering measurement module may include a communications module configured to transmit a data set indicating a measurement of power produced by the renewable energy power source to a receiving unit. For example, the receiving unit may be installed at the utility company to facilitate measurements and energy production (generation) statistics that may be used for purchased power agreement transactions and for other purposes. Similarly, the received measurement data may be used for resource planning, or to alert customers of power generation performance issues involving the customer's renewable energy source. The communication module may include a cellular, Wi-Fi, Zigbee, or Bluetooth® transmitter, or other wireless technology as known in the art.

Figure 8:
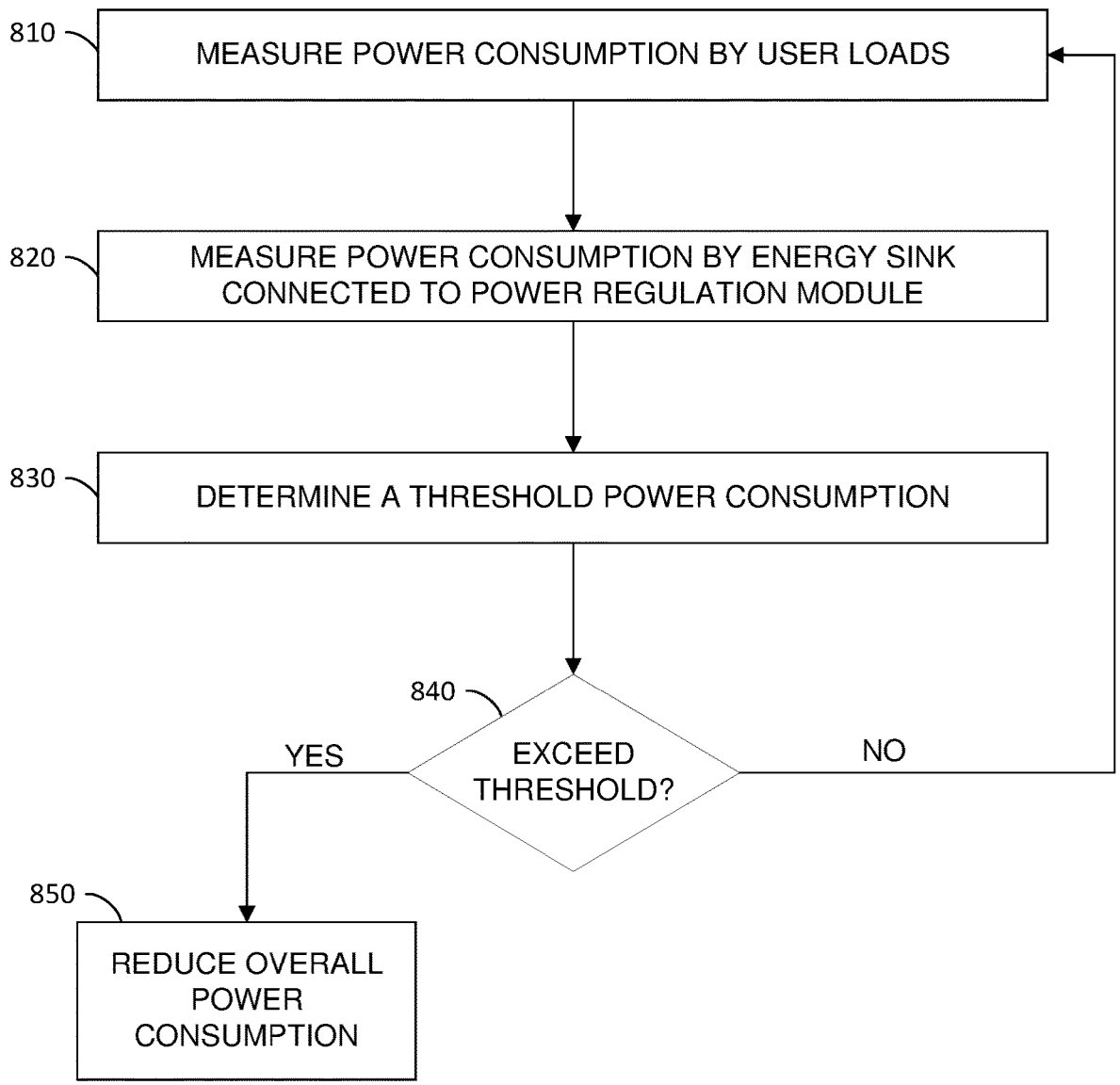
FIG. 8 illustrates an example process for managing power consumption by an energy sink, along with power consumption of user loads, in accordance with embodiments disclosed herein.

As discussed above with respect to FIGS. 6 and 7, the power regulation module in various embodiments may be configured to manage power consumption by energy sinks. FIG. 8 illustrates an example method of managing power consumption by an energy sink (e.g., an electric vehicle or stationary battery). At 810, the power consumption by user loads is measured. In various embodiments, the power consumption of the user loads may be measured by the interconnection meter socket adapter, and the information communicated to the power regulation module. Where smart loads are present, the power regulation module may obtain the power consumption of each smart load over a wired or wireless communication link.

At 820, the power consumption of an energy sink connected to the power regulation module is measured. In various embodiments, the energy sink may be an electric vehicle connected to the power regulation module. As discussed above, the power regulation module may include a measurement module configured to measure power drawn by the connected energy sink.

At 830, a net power consumption value is compared to a pre-determined threshold (modify FIG. 8). In general, net power consumption at the user's location should stay below 80% of the main panel rating. For example, where the main panel is rated for 200 Amps, consumption at the user (from all user loads and energy sinks) should remain at below 160 Amps. In various embodiments, the main panel rating may be obtained from the meter, and a threshold power consumption value may be determined. In other embodiments, the power regulation module may include a memory storing a predetermined threshold based on the main panel rating. The threshold may be between 70% and 90% of a main panel rating in various embodiments.

At 840, the overall net power consumption is compared against the pre-determined threshold. If the threshold is not exceeded, no action need be taken to reduce the power consumption by the user. In such cases, the method will return to 810 and continue monitoring the overall power consumption by the user. Where the threshold is exceeded, the overall power consumption is reduced at 850. In various embodiments, the overall power consumption may be reduced by disconnecting the energy sink coupled through the power regulation module. In other embodiments, a limiter or other power regulation component may be used by the power regulation module to modulate or throttle the power consumption of the energy sink. Where smart loads are present, the power regulation module may send a power reduction signal to the smart loads to reduce the overall power consumption, to remain under the pre-determined threshold.

Figure 9:
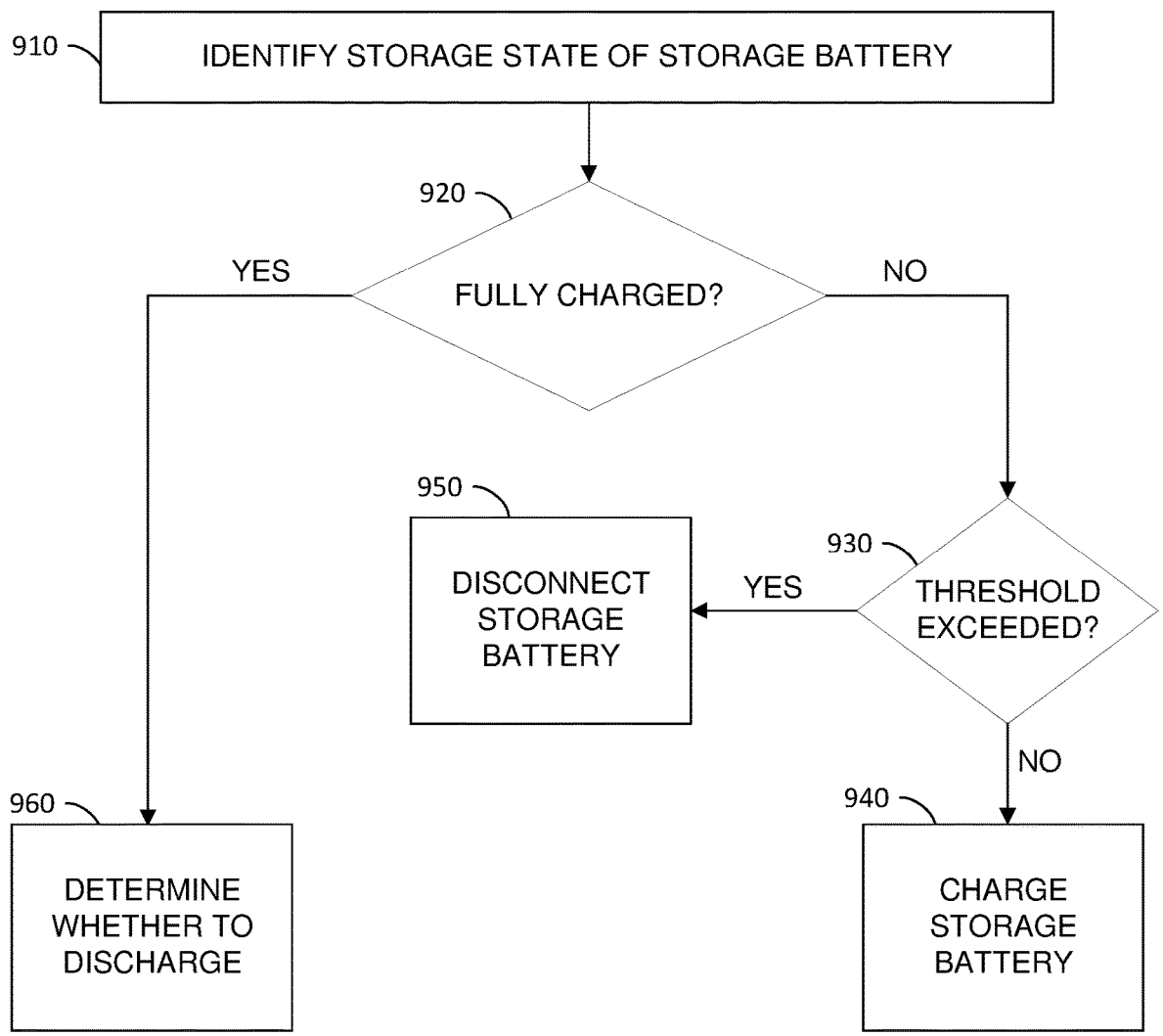
FIG. 9 illustrates an example process for managing power interaction for a combined energy source/sink (e.g., a storage battery), in accordance with embodiments disclosed herein.

In some embodiments, a device attached to the power regulation module may be both an energy source and an energy sink, depending on the situation. Such an example device is a storage battery, which may both store energy derived from the power grid, and also discharge the stored energy when necessary. In such embodiments, the power regulation module may be configured to manage when a battery should be in a charging mode, and when the stored energy should be distributed. FIG. 9 illustrates an example method of managing power interaction with a combined energy source/sink in accordance with embodiments of the technology disclosed herein. At 910, the current energy storage state of the storage battery is identified. The power regulation module may use an energy or power measurement device to measure and track the amount of energy stored in the storage battery in various embodiments.

If no energy is stored in the storage battery, or if the battery is not fully charged to maximum capacity, the power regulation module may determine at 930 whether a threshold of total power consumption is exceeded by charging further. The determination of whether a threshold is exceeded may be made similar to the method discussed with respect to FIG.

8. If the threshold has not been exceeded, the power regulation module may couple the storage battery to the power grid for charging at 940. If the threshold has been exceeded, the power regulation module may disconnect the storage battery at 950, so that the storage battery does not overload the distribution panel. In some embodiments, a battery may be coordinated with an energy sink and net consumption to allow power flow at higher values to the energy sink, while keeping net power flow below the pre-determined value.

If the storage battery is partially or fully charged at 920, the power regulation module may determine whether to discharge the storage battery at 960. This determination may be made in accordance with the energy exchange method discussed with respect to FIGS. 11, 12, and 13.

The power management may vary based on the size of the distribution panel in which the interconnection meter socket adapter is installed. The interconnection meter socket adapter is applicable to any sized, non-current transformer (i.e. self-contained meter), distribution panel. For example, the interconnection meter socket adapter may be implemented in a distribution panel with ratings of 400 Amps or less. For current transformer panels the interconnection meter socket adapter is not applicable, as all of the current drawn by the user does not flow through the meter.

Figure 10:
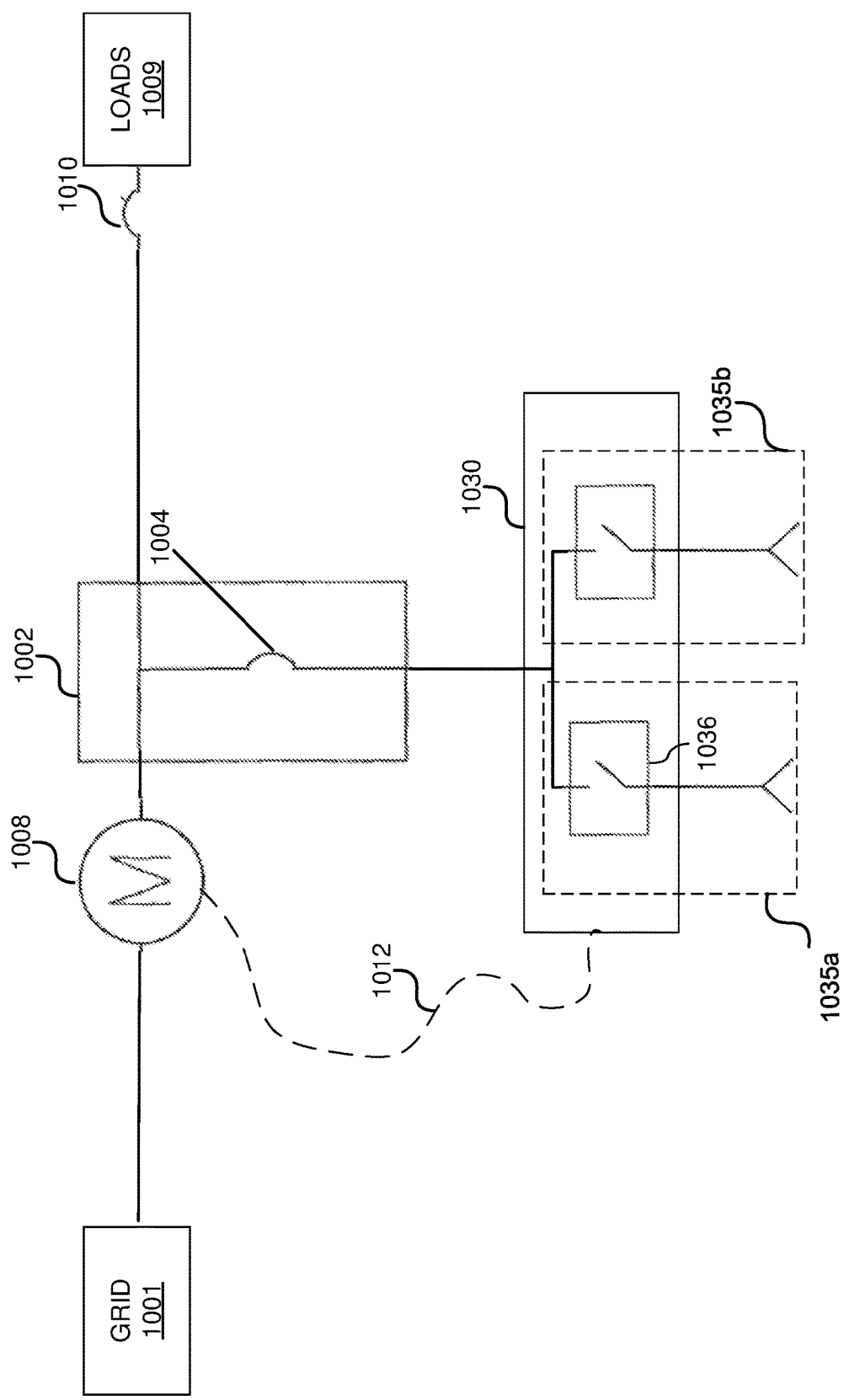
FIG. 10 is a diagram illustrating an example installation of an interconnection meter socket adapter coupled to an energy sink and energy source, in accordance with embodiments disclosed herein.

Until this point, the different installations of the interconnection meter socket adapter have been discussed with respect to a single energy source or energy sink connected through a power regulation module. In various embodiments, the power regulation module may be configured to enable multiple energy sources, energy sinks, or a combination thereof to be physically connected to the power regulation module, but only selectively connected to or servicing the power grid. FIG. 10 is a diagram illustrating an example installation of an interconnection meter socket adapter with a power regulation module connecting multiple energy sources and sinks, in accordance with embodiments of the present disclosure. As illustrated, a modified power regulation module 1030 may include multiple connections enabling one or more energy sources, sinks, or a combination of both to be coupled to the power regulation module 1030. For example, in the illustrated embodiment, a renewable energy source and an electrical sink (e.g., EVSE) are coupled to the power regulation module 1030. In various embodiments, each connection in the power regulation module 1030 may have a disconnect or other means disposed in the circuitry from the connected energy source or sink to the interconnect socket adapter 1002. In some embodiments, the switch may be an automatic transfer switch. In some embodiments, the power regulation module 1030 may include a net-metering measurement module, similar to the net-metering measurement module 711 discussed with respect to FIG. 7.

Referring still to FIG. 10, power regulation module 1030 may include a measurement module and a communication module, similar to the modules discussed above with respect to FIG. 6. The measurement module (e.g., voltage meter, current meter, or other known power measurement device) may measure the amount of power consumption through the power regulation module 1030 and, where a net-metering measurement module is also included, the net power consumption. In various embodiments, the power regulation module 1030 may communicate with utility revenue meter 1008 via a wireless or wired communications link 1012, such that the power regulation module 1030 may know the net amount of power being consumed by the other user loads 1009. With this information, the power regulation module 1030 may determine how to manage the connected energy sources and/or sinks. In various embodiments, the power regulation module 1030 may determine to disconnect each of the energy sources and/or sinks where the power regulation module 1030 determines that the total power consumption through the distribution panel (not shown) is over 80% of the rated limit of the distribution panel. For example, for an interconnect meter socket adapter 1002 installed in a 200 Amp-rated distribution panel, the power regulation module 1030 may determine to disconnect all energy sinks when the power demand rises above 160 Amps. In this way, the power regulation module 1030 may avoid a user overloading the distribution panel by drawing too much power from the power grid 1001. In various embodiments, instead of simply disconnecting energy sources or sinks, the power regulation module 1030 may modulate the power flow to ensure that an overload situation is avoided. For example, a user's electric vehicle may be charged at full capacity without overloading the distribution panel, by having the power regulation module act to supply all or some of that power demand by releasing energy from a stationary battery on the premise. Such a scheme would provide more rapid EV charging while avoiding the need to upgrade the distribution panel.

In various embodiments, some or all of the user loads 1009 may be so-called "smart loads", having measurement, processing and communication components. Where such smart loads are included, the power regulation module 1030 may be further configured to communicate with the smart load subset of the user loads 1009. In this way, the power regulation module 1030 may obtain additional information about power consumption by user loads relevant for determining how to manage the connection of one or more sources or sinks through the power regulation module 1030. Power regulation module 1030 may communicate with such smart loads over wired or wireless communication link(s) 1012, or another wired or wireless communications link. In various embodiments, the power regulation module 1030 may be able to send a power consumption reduction signal to the smart loads to further ensure that the distribution panel is not overloaded. Further, the power regulation module 1030 may send a dispatch signal to the renewable energy source, to adjust the reactive power flow to help limit net current, while avoiding the need to reduce real power flow.

Figure 11:
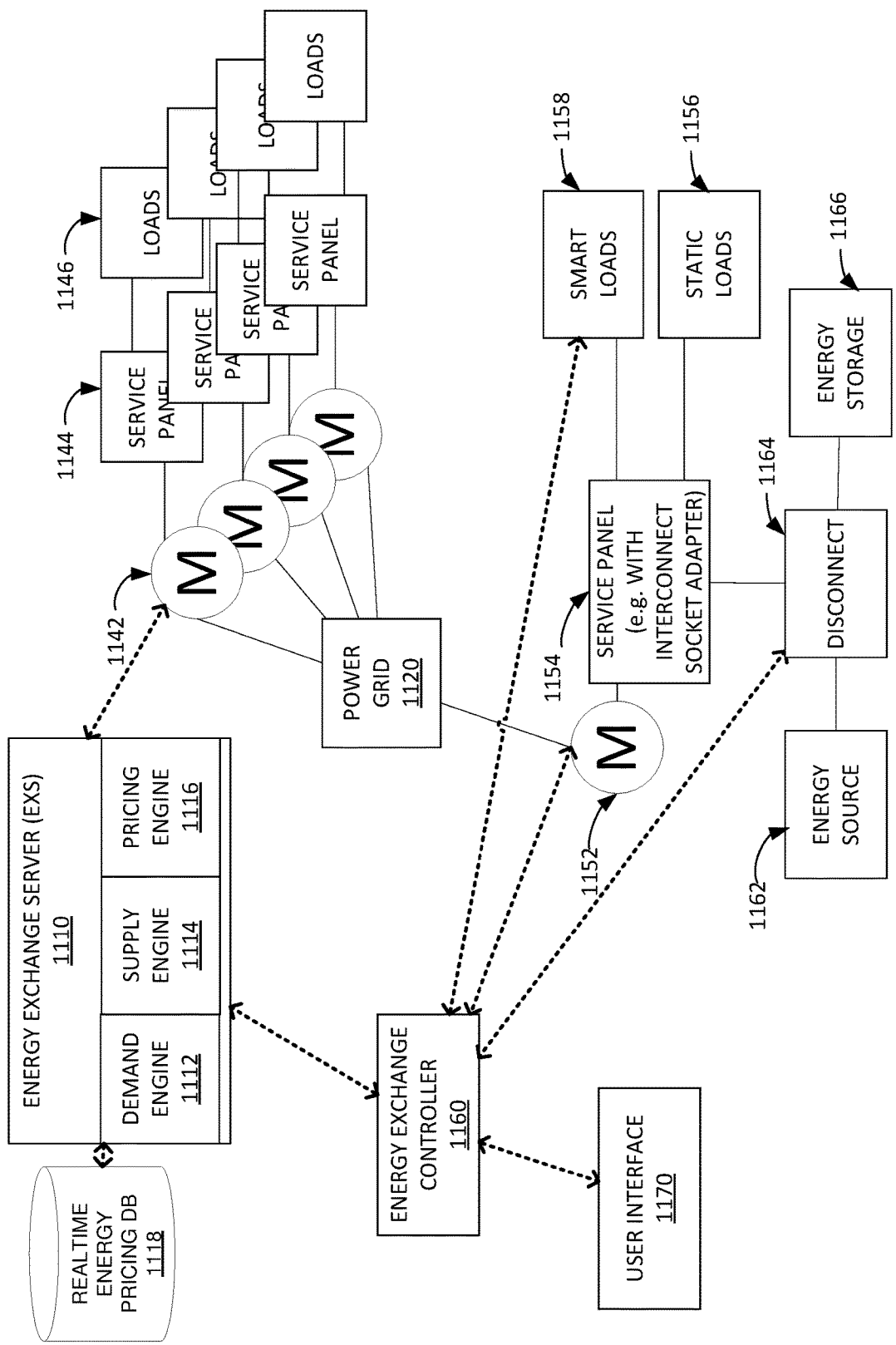
FIG. 11 illustrates an energy exchange system for controlling consumer-based aggregate energy consumption or production based on market supply and demand, consistent with embodiments disclosed herein.

Implementing embodiments disclosed herein may enable the creation of an energy exchange system, e.g., an energy market whereby utilities may enable consumers to provide excess generated and/or stored energy back to the grid. FIG. 11 illustrates an energy exchange system for controlling consumer-based energy consumption or production based on market supply and demand. For example, an energy exchange server (EXS) 1110 may communicate, via Internet, wireless, telephone, or other network data communication channels known in the art, with real-time energy pricing database 1118, a plurality of consumer service meters 1142, and one or more energy exchange controllers 1160. The EXS 1110 may include multiple components configured to evaluate energy market forces, such as supply and demand, to determine market equilibrium pricing thresholds.

For example, EXS 1110 may include a demand engine 1112 configured to receive data from consumer service (utility revenue) meters 1142 and 1152 (in some cases, via an energy exchange controller 1160), or from other data metering locations on power grid 1120, to determine average aggregate electricity demand over a present time frame. Demand engine 1112 may also receive environmental parameters, such as current temperature, forecast temperature, forecast weather, time of day, or other environmental parameters that may affect consumer demand to estimate fluctuations in demand within the present time period, or in future time periods. In some examples, demand engine 1112 may use empirical historical energy demand data stored in the real-time energy pricing database 1118, or available from other sources.

EXS 1110 may also include a supply engine 1114 configured to receive data from consumer service meters 1142 and 1152 (in some cases, via an energy exchange controller 1160), from other data metering locations on power grid 1120, and from energy production facilities, to determine average aggregate electricity supply over the present time frame. Supply engine 1112 may also receive environmental parameters, such as time of day, weather conditions (i.e., that may affect solar or wind power production), maintenance and availability of energy production facilities, fuel availability and pricing, or other environmental parameters that may affect energy supply, and to estimate fluctuations in supply within the present time period, or in future time periods. In some examples, supply engine 1112 may use empirical historical energy supply data stored in real-time energy pricing database 1118, or available from other sources.

EXS 1110 may also include a pricing engine 1116 configured to calculate a current energy price for the present time period. For example, pricing engine 1116 may receive a starting energy price from real-time energy pricing database 1118, an energy demand data set from demand engine 1112, and an energy supply data set from energy supply engine 1114. Pricing engine 1116 may then calculate a current energy price as a function of the starting energy price, energy demand data set, and energy supply data set by calculating an equilibrium instantaneous price point, as well as an estimated equilibrium price range over the course of the present time period. For example, time period may be measured in minutes, hours, days, or other useful time frames. EXS 1110 may further be configured to send the current energy price to energy exchange controller 1160.

In some examples, EXS 1110 may use a current energy price entered into the system manually or collected from public data sources, such as public markets and financial exchanges. In such examples, EXS 1110 would not require additional components (e.g., demand engine 1112, supply engine 1114, or pricing engine 1116) to determine the current energy price, from other data metering locations on power grid 1120, and from energy production facilities, to determine average aggregate electricity supply over the present time frame. Supply engine 1112 may also receive environmental parameters, such as time of day, weather conditions (i.e., that may affect solar or wind power production), maintenance and availability of energy production facilities, fuel availability and pricing, or other environmental parameters that may affect energy supply, and to estimate fluctuations in supply within the present time period, or in future time periods. In some examples, supply engine 1112 may use empirical historical energy supply data stored in real-time energy pricing database 1118, or available from other sources.

In some embodiments, demand engine 1112, supply engine 1114, and pricing engine 1116 may include a computer processor and a non-transitory computer readable media with software embedded thereon, wherein the software is configured to perform the functions of the demand engine, supply engine, or pricing engine, as disclosed herein.

Still referring to FIG. 11, consumers may receive, and in some cases, contribute energy to power grid 1120. For example, some consumers will receive energy through service meters 1142 and service panels 1144 to supply energy to loads 1146. For example, load 1146 may include standard household appliances, lights, electric vehicle batteries, stationary batteries, or other energy sinks as known in the art.

Some consumers may have equipment configured to interact with the EXS. For example, some consumers may receive power through meter 1152 and service panel 1154, wherein meter 1152 is configured to communicate with an energy exchange controller 1160. Energy exchange controller 1160 may include a computer processor and a non-transitory computer readable media with energy exchange control software embedded thereon, the energy exchange control software configured to receive a current energy price from EXS 1110, threshold parameters from user interface 1170, or from another data source, and regulate local power sources and sinks to manage energy exchange with power grid 1120. For example, if the current energy price exceed a predetermined threshold value, energy exchange controller 1160 may alert a user through user interface 1170, or send power consumption reduction signals to certain smart loads 1158, to reduce overall power consumption and allow power produced by the consumer via power source 1162 (e.g., solar power, wind power, geothermal power, generator, etc.) to flow out onto power grid 1120. In return, the consumer may be compensated at the current energy price for each unit of energy and/or power sold back to the power grid 1120.

In some examples, smart loads 1158 may include smart appliances capable of turning off or reducing power consumption in response to a power consumption reduction signal from the energy exchange controller 1160. The power consumption reduction signal may be transmitted via a LAN, wireless, cellular, Ethernet-over-power, or other known communication channel. In some examples, smart loads 1158 may include a smart power adapter located between the service panel 1154 and an appliance, or other energy load. For example, a smart power adapter may plug into a wall outlet, and include a receptacle (or multiple receptacles) to accept connections from an appliance or appliances. The smart power adapter may turn power on or off, or otherwise regulate power, in response to power consumption reduction signals sent by energy exchange controller 1160.

In some embodiments, an energy storage device may also be included on a consumer power network. The energy storage device (e.g., stationary battery, an electric vehicle battery, or other energy storage system) may be configured to respond to signals from the energy exchange controller 1160 to either enter a sink mode when energy prices are lower (e.g., to store energy and recharge), and enter a source mode when energy prices are higher (e.g., to sell power back out onto the power grid 1120, or to supplement local power demand to avoid purchasing power from power grid 1120 when prices are higher, or to avoid overloading a distribution panel).

In some embodiments, service panel 1154 includes an interconnect socket adapter as disclosed herein, and the interconnect socket adapter couples to disconnect 1164, which may be coupled to energy source 1162, energy storage 1166, or both.

Figure 12:
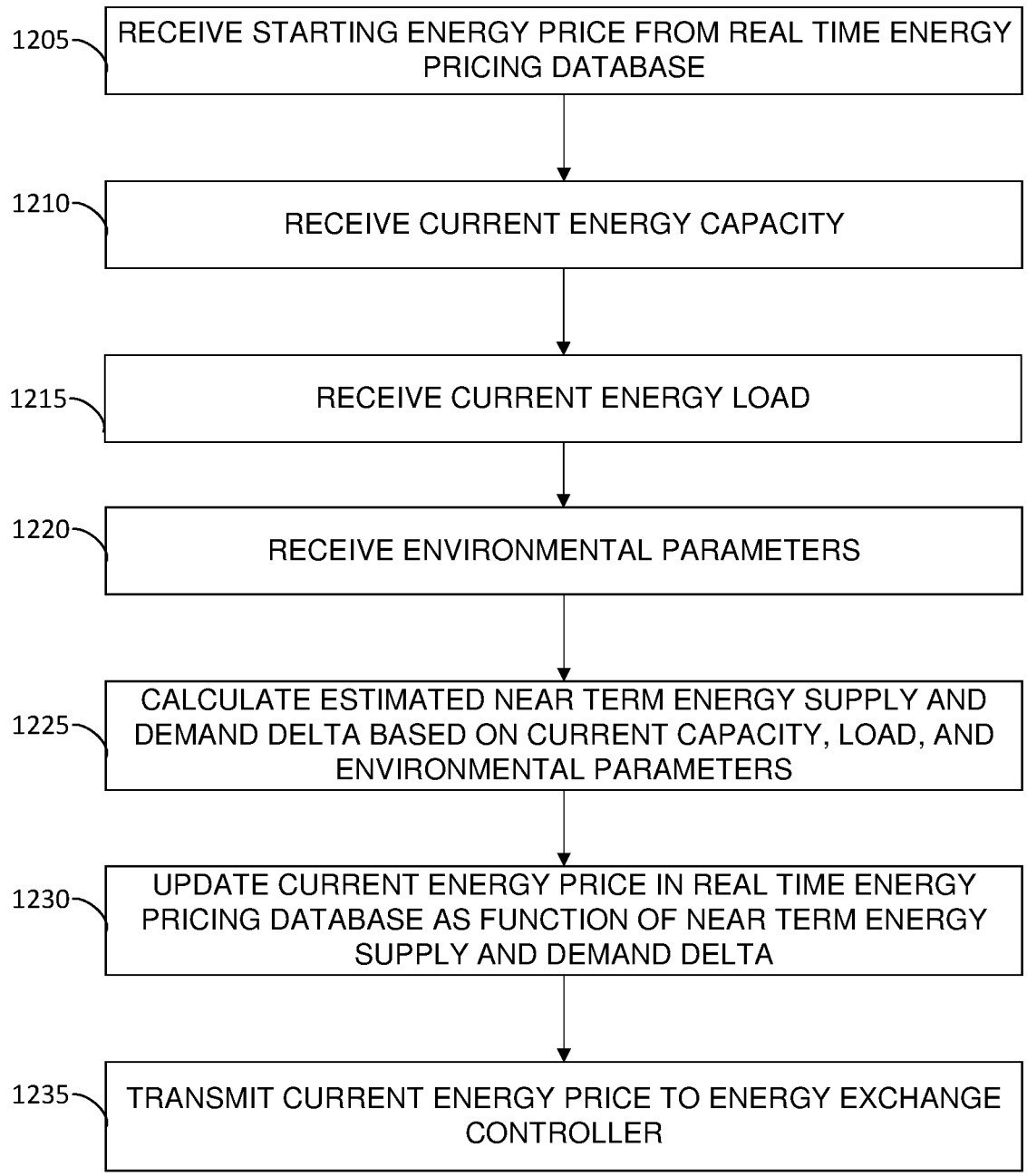
FIG. 12 illustrates a process for determining current energy pricing based on supply and demand, consistent with embodiments disclosed herein.

FIG. 12 illustrates a process for determining current energy pricing based on supply and demand. For example, a process for determining current energy pricing may include receiving a starting energy price at step 1205. For example, the starting energy price may be received from a real-time energy pricing database, a user input, or from a public data source. The process may further include receiving current energy capacity (i.e., supply) and current energy load (e.g., demand) at steps 1210 and 1215 respectively. In some examples, the current energy capacity may be an average aggregate energy supply over a present time period across a local region of the power grid, and the demand may be an average aggregate energy demand over a present time period across a plurality of consumers within the local region of the power grid. The process may further include receiving a set of environmental variables at step 1220. For example, environmental parameters may represent the time-of-day, season, current weather, forecast weather, current market conditions or prices for fuels such as natural gas, coal, oil, or nuclear, power plant maintenance or availability data, or other parameters that could affect supply or demand.

Still referring to FIG. 12, a process for determining current energy pricing may further include calculating an estimated near term energy supply and demand delta as a function of supply, demand, and environmental parameters at step 1225. The process may further include updating a current energy price in the real-time energy pricing database (1118 in FIG. 11) as a function of the near term energy supply and demand delta and transmitting the current energy price to one or more energy exchange controllers at steps 1230 and 1235, respectively. In some embodiments, the process may further include estimating future energy prices based on the current energy price and environmental parameters or calculated pricing trends.

Figure 13:
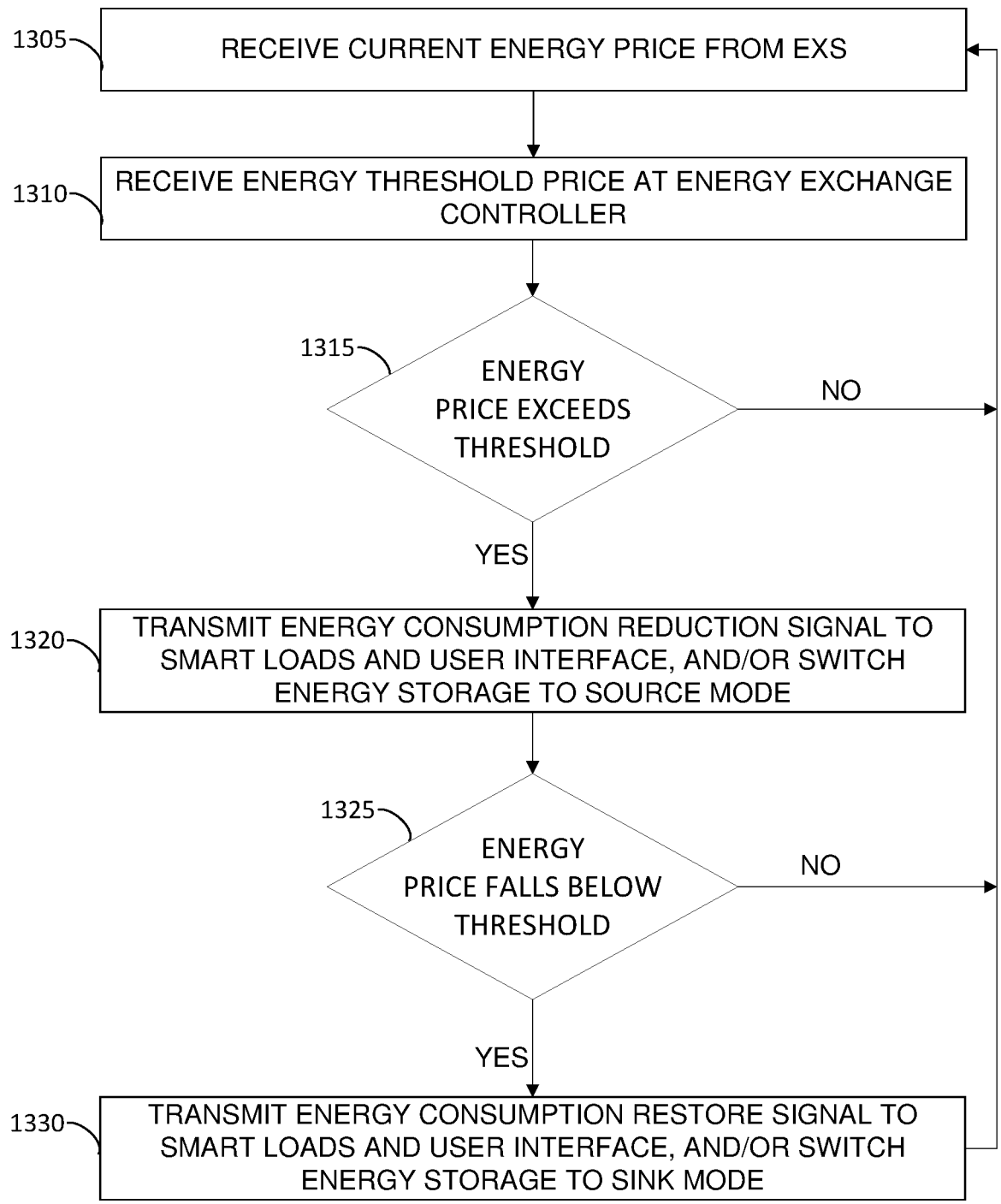
FIG. 13 illustrates a process for controlling power consumption according to current price, consistent with embodiments disclosed herein.

FIG. 13 illustrates a process for controlling power consumption according to current price. A process for controlling power consumption may include receiving the current energy price at step 1305. For example, the current energy price may be calculated on an EXS according to embodiments disclosed herein, and may be set for a present time period. In some embodiments, the process may further include receiving further estimated energy prices.

A process for controlling power consumption may further include receiving an energy threshold price at step 1310. For example, the energy threshold price may be manually entered by a user through a user interface, may be predefined in an energy exchange controller, or may be transmitted from a central location, such as the EXS. The process may then include evaluating, by the energy exchange controller, whether the current energy price exceeds the energy price threshold at step 1315. If the threshold is not exceeded, the process may repeat, either continuously, or at predefined intervals. However, if the threshold is exceeded, the process may include transmitting an energy consumption reduction signal within a local consumer power network at step 1320. For example, the energy exchange controller may transmit the demand reduction signal to one or more smart loads.

In some examples, the demand reduction signal may be sent to a user interface to alert a user to turn off appliances or generally reduce power consumption. In some examples, the demand reduction signal may also be sent to an energy storage device to change the mode of the energy storage device to a source mode. A result of any of these reductions in demand or increases in production on the consumer's local power network will either be to reduce overall power demand, and thus reduce the consumer's energy costs, or may also put the consumer's production (i.e., as generated from renewable energy sources, generators, or from an energy storage device) back onto the power grid in return for compensation to the consumer at the current, relatively high energy unit price.

Still referring to FIG. 13, a process for controlling power consumption may further include evaluating whether the current energy price has fallen below the energy price threshold at step 1325. In some cases, this may be a separately defined energy price threshold than the threshold discussed with respect to steps 1315 and 1320. If the current energy price falls below the energy price threshold at step 1325, then the process may include transmitting demand restoration signal at step 1330. For example, the demand restoration signal may be sent to a user interface to alert the user that appliances may be turned back on, EV charged, etc. The signal may also be sent to smart loads to re-enable demand automatically. In some examples, the signal may also be sent to an energy storage device to configure the energy storage device to sink (recharge) mode such that the device will store energy collected from the power grid at relatively low prices, for later use.

Figure 14:
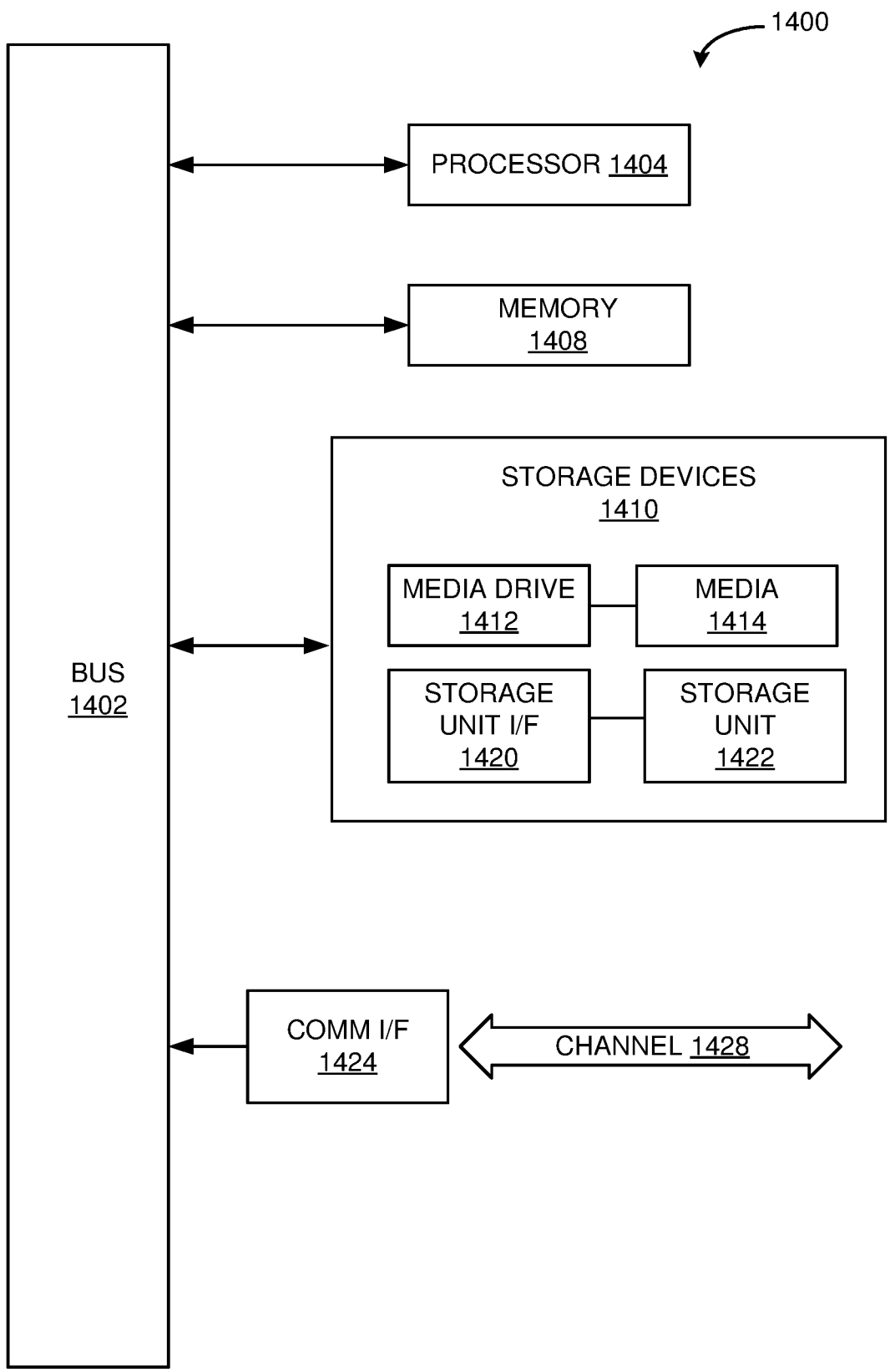
FIG. 14 illustrates an example computing module that may be used in implementing various features of embodiments disclosed herein.

As used herein, the term module might describe a given unit of functionality that can be performed in accordance with one or more embodiments of the technology disclosed herein. As used herein, a module might be implemented utilizing any form of hardware, software, or a combination thereof. For example, one or more processors, controllers, ASICs, PLAs, PALs, PLC's, CPLDs, FPGAs, RTU's, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that physically or electrically separate hardware or software components are used to implement such features or functionality.

Where components or modules of the technology are implemented in whole or in part using software, in one embodiment, these software elements can be implemented to operate with a computing or processing module capable of carrying out the functionality described with respect thereto. One such example computing module is shown in FIG. 14. Various embodiments are described in terms of this example-computing module 1400. After reading this description, it will become apparent to a person skilled in the relevant art how to implement the technology using other computing modules or architectures.

Referring now to FIG. 14, computing module 1400 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 1400 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 1400 might include, for example, one or more processors, controllers, control modules, or other processing devices, such as a processor 1404. Processor 1404 might be implemented using a general-purpose or special-purpose processing engine such as, for example, a microprocessor, controller, or other control logic. In the illustrated example, processor 1404 is connected to a data bus 1402, although any communication medium can be used to facilitate interaction with other components of computing module 1400 or to communicate externally.

Computing module 1400 might also include one or more memory modules, simply referred to herein as main memory 1408. For example, preferably random access memory (RAM) or other dynamic memory, might be used for storing information and instructions to be executed by processor 1404. Main memory 1408 might also be used for storing temporary variables or other intermediate information during execution of instructions to be executed by processor 1404. Computing module 1400 might likewise include a read only memory ("ROM") or other static storage device coupled to bus 1402 for storing static information and instructions for processor 1404.

The computing module 1400 might also include one or more various forms of information storage mechanism 1410, which might include, for example, a media drive 1412 and a storage unit interface 1420. The media drive 1412 might include a drive or other mechanism to support fixed or removable storage media 1414. For example, a hard disk drive, a floppy disk drive, a magnetic tape drive, an optical disk drive, a CD or DVD drive (R or RW), or other removable or fixed media drive might be provided. Accordingly, storage media 1414 might include, for example, a hard disk, a floppy disk, magnetic tape, cartridge, optical disk, a CD or DVD, or other fixed or removable medium that is read by, written to or accessed by media drive 1412. As these examples illustrate, the storage media 1414 can include a computer usable storage medium having stored therein computer software or data.

In alternative embodiments, information storage mechanism 1410 might include other similar instrumentalities for allowing computer programs or other instructions or data to be loaded into computing module 1400. Such instrumentalities might include, for example, a fixed or removable storage unit 1422 and an interface 1420. Examples of such storage units 1422 and interfaces 1420 can include a program cartridge and cartridge interface, a removable memory (for example, a flash memory or other removable memory module) and memory slot, a PCMCIA slot and card, and other fixed or removable storage units 1422 and interfaces 1420 that allow software and data to be transferred from the storage unit 1422 to computing module 1400.

Computing module 1400 might also include a communications interface 1424. Communications interface 1424 might be used to allow software and data to be transferred between computing module 1400 and external devices. Examples of communications interface 1424 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 1424 might typically be carried on signals, which can be electronic, electromagnetic (which includes optical) or other signals capable of being exchanged by a given communications interface 1424. These signals might be provided to communications interface 1424 via a channel 1428. This channel 1428 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1408, storage unit 1420, media 1414, and channel 1428. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1400 to perform features or functions of the disclosed technology as discussed herein.

While various embodiments of the disclosed technology have been described above, it should be understood that they have been presented by way of example only, and not by way of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A power exchange, comprising: an energy exchange server and a plurality of energy exchange controllers electrically coupled to a power grid, each energy exchange controller being communicatively coupled to an interconnect socket adapter; wherein the energy exchange server comprises a processor and a non-statutory computer readable medium with software embedded thereon, the software configured to: receive, from each interconnect socket adapter, a real-time energy consumption data set; receive, from a real-time energy pricing database, a set of environmental parameters and a starting energy price; receive, from each interconnect socket adapter and one or more energy production facilities, a real-time energy production data set; generate a current aggregate electricity demand value as a function of the realtime energy consumption data set and the environmental parameters; generate a current aggregate electricity supply value as a function of the real-time energy production dataset and the environmental parameters; and generate a current energy price as a function of the starting energy price, the current aggregate electricity demand value, and the current aggregate electricity supply value.

2. The power exchange of claim 1, wherein the software is further configured to cause the energy exchange server to transmit the current energy price to each exchange controller.

3. The power exchange of claim 2, wherein each exchange controller is configured to track an amount of energy sent back into the power grid from a corresponding interconnect socket adapter and the software of the energy exchange server is further configured to generate, for each energy exchange controller, a total energy reimbursement value as a function of the current energy price and the amount of energy sent back into the power grid.

4. The power exchange of claim 2, wherein each exchange controller is configured to, if the current energy price exceeds a threshold, transmit a signal to a user interface to alert users to limit or terminate power consumption, such that power generated through power sources coupled to the interconnect socket adapters may be directed into the power grid.

5. The power exchange of claim 2, wherein each exchange controller is configured to, if the current energy price exceeds a threshold, transmit a signal to limit or terminate power consumption to a one or more energy sinks coupled to the interconnect socket adapters, such that power generated through power sources coupled to the interconnect socket adapters may be directed into the power grid.

6. The power exchange of claim 2, wherein each exchange controller is configured to, if the current energy price falls below a threshold, transmit a signal to a user interface to alert users to increase power consumption or storage.

7. The power exchange of claim 2, wherein each exchange controller is configured to, if the current energy price exceeds a threshold, transmit a signal to increase power consumption or storage to one or more energy sinks coupled to the interconnect socket adapters, such that power generated through power sources coupled to the interconnect socket adapters may be directed into the power grid.

8. The power exchange of claim 1, wherein the set of environmental parameters comprises a current temperature, a forecast temperature, a forecast weather condition, a time of day, a maintenance activity, an availability of fuel, a price of fuel, or an estimated future price of fuel.

9. A computer-implemented method for exchanging power, comprising: receiving, with an energy exchange server, a real-time energy consumption data set and a real-time energy production data set; receiving, with the energy exchange server, a set of environmental parameters and a starting energy price; generating a current aggregate electricity demand value as a function of the realtime energy consumption data set and the environmental parameters; generating a current aggregate electricity supply value as a function of the realtime energy production dataset and the environmental parameters; and generating a current energy price as a function of the starting energy price, the current aggregate electricity demand value, and the current aggregate electricity supply value.

10. The method of claim 9, further comprising transmitting the current energy price to each of a plurality of exchange controllers, wherein each exchange controller communicatively couples to an interconnect socket adapter.

11. The method of claim 10, further comprising tracking an amount of energy sent back into the power grid from each interconnect socket adapter and generating, for each energy exchange controller, a total energy reimbursement value as a function of the current energy price and the amount of energy sent back into the power grid.

12. The method of claim 10, further comprising transmitting, if the current energy price exceeds a threshold, a signal to a user interface to alert users to limit or terminate power consumption, such that power generated through power sources coupled to the interconnect socket adapters may be directed into the power grid.

13. The method of claim 10, further comprising transmitting, if the current energy price exceeds a threshold, a signal to limit or terminate power consumption to a one or more energy sinks coupled to the interconnect socket adapters, such that power generated through power sources coupled to the interconnect socket adapters may be directed into the power grid.

14. The method of claim 10, further comprising transmitting, if the current energy price falls below a threshold, a signal to a user interface to alert users to increase power consumption or storage.

15. The method of claim 10, further comprising transmitting, if the current energy price falls below a threshold, a signal to increase power consumption or storage to one or more energy sinks coupled to the interconnect socket adapters, such that power generated through power sources coupled to the interconnect socket adapters may be directed into the power grid.

16. The method of claim 9, wherein the set of environmental parameters comprises a current temperature, a forecast temperature, a forecast weather condition, a time of day, a maintenance activity, an availability of oil, a price of oil, or an estimated future price of oil.

\* \* \* \* \*